(12) United States Patent
Egerton et al.

(10) Patent No.: US 9,945,720 B1
(45) Date of Patent: Apr. 17, 2018

(54) INFRARED RADIATION DETECTORS USING BUNDLED-VXOY OR AMORPHOUS SILICON NANOPARTICLES NANOSTRUCTURES AND METHODS OF CONSTRUCTING THE SAME

(71) Applicant: Magnolia Optical Technologies, Inc., Woburn, MA (US)

(72) Inventors: Elwood J. Egerton, Hot Springs, SD (US); Ashok K. Sood, Brookline, MA (US)

(73) Assignee: Magnolia Optical Technologies, Inc., Woburn, MA (US)

( * ) Notice: Subject to any disclaimer, the term of this patent is extended or adjusted under 35 U.S.C. 154(b) by 0 days.

(21) Appl. No.: 14/757,708

(22) Filed: Dec. 22, 2015

Related U.S. Application Data

(60) Provisional application No. 62/095,747, filed on Dec. 22, 2014.

(51) Int. Cl.
*G01J 5/20* (2006.01)
*G01J 1/44* (2006.01)
*H01L 31/09* (2006.01)
*H01L 31/028* (2006.01)

(52) U.S. Cl.
CPC .............. *G01J 1/44* (2013.01); *H01L 31/028* (2013.01); *H01L 31/095* (2013.01)

(58) Field of Classification Search
CPC ...... G01J 5/02; G01J 5/023; G01J 5/20; G01J 5/10

USPC ........................................... 250/338.4, 338.1
See application file for complete search history.

(56) References Cited

U.S. PATENT DOCUMENTS

| 6,400,088 | B1 | 6/2002 | Livingston et al. | |
| 8,110,883 | B2 | 2/2012 | Ward et al. | |
| 8,916,825 | B1* | 12/2014 | Egerton | G01J 5/046 |
| | | | | 250/338.4 |
| 2012/0329640 | A1* | 12/2012 | Bosnyak | C01B 31/0273 |
| | | | | 502/100 |

* cited by examiner

*Primary Examiner* — David Porta
*Assistant Examiner* — Meenakshi Sahu
(74) *Attorney, Agent, or Firm* — Loginov & Associates; William A. Loginov (57) ABSTRACT

The use of silicon or vanadium oxide nanocomposite consisting of graphene deposited on top of an existing amorphous silicon or vanadium oxide microbolometer can result in a higher sensitivity IR detector. An IR bolometer type detector consisting of a thermally isolated nano-sized (<one micron feature size) electro-mechanical structure comprised of Si3N4, SiO2 thins films, suspended over a cavity with a copper thin film reflecting surface is described. On top of the suspended thin film is a nanostructure composite comprised of graphene monolayers, covered with various surface densities of VoXy or amorphous nanoparticles, followed by another graphene layer. The two conducting legs are connected to a readout integrated circuit (ROIC) fabricated on a CMOS wafer underneath. The nanostructure is fabricated after the completion of the ROIC process and is integrate able with the CMOS process.

7 Claims, 8 Drawing Sheets

NANOPARTICLE- GRAPHENE
NANOCOMPOSITE CROSS SECTION

Fig. 1

NANOPARTICLE- GRAPHENE
NANOCOMPOSITE CROSS SECTION

Fig. 1B

NANOPARTICLE EMBEDDED BETWEEN GRAPHENE LAYERS

VOx MICROBOLOMETER PROCESS FLOW

Fig. 3A — 1 REFLECTOR LAYER

Fig. 3B — 2 POLYMIDE

Fig. 3C — 3 Si3N4 AND SiO2

Fig. 3D — 4 METAL CONTACT AND ALPHA SILICON LAYER

Fig. 3E — 5 SiO2, GOLD BLACK AND Si3N4

Fig. 3F — 6 SACRIFICIAL LAYER PATTERNING & RELEASE

NOTE 1

SiO2 102 | Si3N4 103 | Au 105 | GOLD BLACK 108 | VOx 109 | Si 101 | POLYIMIDE 104

NOTE 1: ALL SLANTED HATCH PATTERNS ARE 102 (SiO2).

INFRARED RADIATION DETECTORS USING BUNDLED-VXOY OR AMORPHOUS SILICON NANOPARTICLES NANOSTRUCTURES AND METHODS OF CONSTRUCTING THE SAME

RELATED APPLICATIONS

This application claims the benefit of U.S. Provisional Application Ser. No. 62/095,744, filed Dec. 22, 2014, entitled INFRARED RADIATION DETECTORS USING BUNDLED-VXOY OR AMORPHOUS SILICON NANO-PARTICLES NANOSTRUCTURES AND METHODS OF CONSTRUCTING THE SAME, the entire disclosure of which is herein incorporated by reference.

FIELD OF THE INVENTION

The present application relates generally nanoparticle bundled graphene fabrics and methods of making same.

BACKGROUND OF THE INVENTION

Photodetectors are an integral part of optical circuits and components (for example emitters, modulators, repeaters, waveguides or fibers, reflectors, resonators, detectors, IR Focal plane arrays, etc.) and are used for the sensing of electromagnetic radiation. There are several approaches to these devices. Photoconducting materials, typically semiconductors, have electrical properties that vary when exposed to electromagnetic radiation (i.e. light). One type of photoconductivity arises from the generation of mobile carriers (electrons or holes) during absorption of photons. For semiconducting materials, the absorption of a specific wavelength of light, hence photon energy, is directly proportional to the band gap of the material ($Eg=hn=hc/l$, where Eg is the materials band gap, h is Plank's constant ($4.136 \times 10^{-15}$ eVs), c is the speed of light in a vacuum ($2.998 \times 10^{10}$ cm/s) and l is the wavelength of the radiation). If the band gap energy is measured in eV (electron Volts) and the wavelength in micrometers, the above equation reduces to $Eg=1.24/l$. A photodiode (i.e. p-n diode, p-i-n photodiode, avalanche photodiode, etc.) is the most commonly employed type of photoconductor.

Light detection is ideally suited for direct band gap semiconductors such as Ge, GaAs, etc.; however, indirect band gap semiconductors (where an additional phonon energy is required to excite an electron from the valence band to the conduction band), such as Silicon, are also used as photodetectors. Probably the most widely known type of photodetctor is the solar cell, which uses a simple p-n diode or Schottky barrier to detect impinging photons. Besides silicon, most photodetectors do not integrate with current microelectronics technology, usually detect only a specific wavelength (i.e. 1.1 mm for Si, 0.87 mm for GaAs, 0.414 mm for a-SiC and 1.89 mm for Ge), and require multiple detectors to detect a broad band of wavelengths (hence photon energy).

There are other types of photodetectors that do not rely on the generation of current through the excitation of electrons (or holes). One such type of detector is the bolometer. Bolometers operate by absorbing radiation, which in turn raises the temperature of the material and hence alters the resistance of the material. Bolometers can be constructed from either metallic, metallic-oxides or semiconducting materials such as vanadium oxide, amorphous silicon. Since bolometers detect a broad range of radiation above a few microns, bolometers are typically thermally stabilized to reduce the possibility of detection of blackbody radiation that is emitted from the detector material, which leads to a high background noise. IR microbolometer detectors and arrays don't require cooling to cryogenic temperatures unlike the other detector technologies discussed. Another type of non-photo-generated detector is the pyroelectric detector. Pyroelectric detectors operate by sensing induced surface charges that are related to changes in the internal dipole moment generated from temperature shifts in the material.

It is possible for IR and visible light to be detected from individual single-walled graphene (SWNTs). Graphene possess discrete absorption peaks that correspond to specific photon energies. For useful background material, refer to U.S. Pat. No. 6,400,088. As described, the absorption peaks of the graphene correlate directly to the diameter of the carbon nanotube.

Thermal infrared detectors, such as microbolometers, are a part of IR systems used to image heat emitted from natural phenomena. The current state of the art microbolometer utilizes vanadium oxide as the element which changes impedance for incoming IR radiation. Despite the improvements to the use and costs of IR focal plane arrays (IRFPAs), which are most sensitive in the LWIR (8-12 microns) and MWIR (3-5 microns), there seems to be a limit to sensitivity at 20 mk NEDT. This performance is restricted by I/f noise and the basic physical properties of the vanadium oxide (VOx) film. In addition, as the needs for increased sensitivity and smaller pixel size below 25 micron, silicon technology has run up against a sensitivity wall due to the scaling of 1/f noise as pixel size are reduced and the absolute noise floor is realized the basic properties of the silicon needs to be optimized for low noise operation.

One solution of the prior art is to use of carbon nanotubes to reduce noise, as described in U.S. Pat. No. 8,110,883, which includes the generations of excitons to produce heat in the IR sensing element to change the TCR response and thereby sensitivity. Carbon nanotubes also have high absorption coefficients of $10^{-4}$ to $10^{-5}$, which is higher than HgCdTE in the 8-12 micron region.

SUMMARY OF THE INVENTION

The present invention overcomes the disadvantages of the prior art by providing a light detector includes a nanoparticle bundled graphene nanostructure article in electrical communication with a first and a second contact; and a detection circuit in electrical communication with the first and second contacts. The detection circuit provides electrical outputs for sufficient light detection from the nanoparticle bundled graphene article in the proximity of the predefined region by use of pre-amplification.

In accordance with the illustrative embodiment, the predefined region where nanoparticle bundled monolayer graphene or multi-monolayer graphene is suspended between the electrodes or lies on a cantilever beam that provides thermal isolation from the surrounding environment.

In accordance with the illustrative embodiment, the predefined region is between two electrical contacts. These electrical contacts provide electrical communication but also are designed for maximum thermal isolation. Use of high resistance metals such as Nickel are required to achieve this.

In accordance with the illustrative embodiment, light detection can be integrated with semiconductor circuits including CMOS circuits which provide pixel array x-y controls, pre-amplification of the modulated resistance signal from the IR detector and the conversion of the analog signal to digital.

In accordance with the illustrative embodiment, the nanoparticle bundled graphene nanostructures increase the temperature coefficient of resistance from state of the art of 20 mK NEDT to less than 10 mK NEDT.

In accordance with the illustrative embodiment nanoparticle bundled graphene detects light by resistance changes in the fabric due to heating.

In accordance with the illustrative embodiment, the IR detector no longer suffers from the Nyquist frequency limitation. This is due to the fact that the Nyquist frequency limitation is due to the presence of I/for flicker noise. (see reference one) Based on measurements conducted by the inventors, bundled graphene exhibit non measureable noise sources of these types. With the obtainment of >approximately 4% per degree kelvin temperature coefficient of resistance (TCR), noise equivalent delta temperature (NEDT) of less than 10 mK will be achievable. In optical systems with Fluoride, the elimination of Nyquist limited behavior will be a vast improvement to IR detection systems performance.

An Infrared (IR) detector comprising: a substrate; a thin film of bundled graphene suspended over the substrate and between electrical contacts; first and second conductive contacts in electrical communication with the thin film of bundled graphene; a layer of amorphous silicon on the substrate; means for forming a cavity in the amorphous silicon layer to thereby create a gap between the bundled carbon nanotube fabric and the substrate such that the bundled carbon nanotube fabric is suspended above the substrate, thereby fabricating the IR detector; wherein the thin film of bundled graphene is tuned to be sensitive to IR radiation in the micron band of 1 to 12 microns and the exposure of IR radiation induces a change in impedance between the first and second conductive terminals which is sensed by CMOS readout circuitry.

In one example, the IR detector further comprises sensing circuitry for detecting changes in input impedance using the CMOS readout circuitry.

In one example, the thin film of bundled graphene is deposited on the substrate having an insulating layer comprised of dielectric material with a cantilever beam composed of silicon nitride, which is suspended over a channel, thereby providing thermal isolation from surrounding environments.

In one example, the nanostructure of nanoparticles bundled graphene is composed of single wall graphene having diameters corresponding to a tuned IR response wavelength.

In one example, the thin film of nanoparticle bundled graphene is composed of multi wall graphene having diameters corresponding to a tuned IR response wavelength.

In one example, the thin film of nanoparticle bundled graphene is composed of monolayer graphene and multi monolayer graphene having diameters corresponding to a tuned IR responsive wavelength.

In one example, the graphene are deposited on the substrate using a chemical vapor deposition (CVD) or mechanical exfoliation process.

In one example, the means for forming a cavity includes means for etching the amorphous silicon using reactive ion etch (RIE) or Ion beam assisted etching.

In one example, the means for forming a cavity includes means for etching the amorphous silicon using Xenon difluoride (XeF2) gas as an etching techniques.

An Infrared (IR) detector comprising: a thin film of nanoparticle bundled graphene suspended between electrical contacts; first and second conductive terminals in electrical communication with the thin film of bundled graphene; the graphene is covered with a high resistance metal such as Ni on the bottom or top surface of the graphene is order to achieve a stable electrical contact. wherein the thin film of bundled graphene is tuned to be sensitive to IR radiation in the micron band of 1 to 12 microns and the exposure of IR radiation induces a change in impedance between the first and second conductive terminals which is sensed by CMOS readout circuitry; and wherein the thin film of bundled graphene is tuned to increase sensitivity of the IR detector by increasing the density of the bundled graphene, which thereby increases the temperature coefficient of resistance (TCR) to excess of 4% per degree centigrade, thereby resulting in a Noise Equivalent Delta Temperature (NEDT) of less than 10 mK.

Oxidation of graphene is undertaken in a temperature range of 100-300 C to obtain the desired oxidation state and electrical conductivity.

The oxidation state of the $V_xO_y$ nanoparticles is modulated to obtain the optimal temperature coefficient of resistance.

An Infrared (IR) detector comprising: a thin film of bundled graphene suspended between electrical contacts; first and second conductive terminals in electrical communication with the thin film of bundled graphene; wherein the thin film of bundled graphene is tuned to be sensitive to IR radiation in the micron band of 1 to 12 microns and the exposure of IR radiation induces a change in impedance between the first and second conductive terminals which is sensed by CMOS readout circuitry.

An Infrared (IR) detector comprising: a thin film of bundled graphene suspended between electrical contacts; first and second conductive terminals in electrical communication with the thin film of bundled graphene; wherein the thin film of bundled graphene is tuned to be sensitive to IR radiation in the micron band of 1 to 12 microns and the exposure of IR radiation induces a change in impedance between the first and second conductive terminals which is sensed by CMOS readout circuitry; and wherein the graphene are aligned in bundles by use of nanoparticles to electrically connect the multilayers of graphene.

Bundled nanoparticles are used to wrap the graphene around the nanoparticles to increase lifetime and stability of microbolometer performance of the detector. This occurs because the c-c bonds of the graphene layers have multiple connection points.

A method for fabricating an infrared (IR) detector, the method comprising the steps of: depositing a silicon oxide film on a substrate; create a hole over a tungsten plug provided in the substrate and disposed below the silicon oxide film; depositing a thin film of copper on the substrate so that the copper film serves as an IR photon reflector, depositing a layer of amorphous silicon on the substrate and planarizing the layer of amorphous silicon by chemical mechanical processing; etch contact holes through the amorphous silicon to clear the amorphous silicon layer and the copper film layer down to a tungsten plug disposed in the CMOS substrate; deposit a CMOS interconnect thin films in the hole above the tungsten plug and delineate interconnect structures; depositing a layer of bundled graphene on the substrate; and etching a cavity in the amorphous silicon layer to thereby create a gap between the bundled carbon nanotube fabric and the substrate such that the bundled carbon nanotube fabric is suspended above the substrate, thereby fabricating the IR detector.

In one example, the silicon oxide film is deposited using standard CMOS microelectronics processing techniques.

In one example, the thin film of copper is deposited using one of electron bean evaporation, electrochemical deposition and direct current sputtering.

In one example, the interconnect structures are delineated using standard photolithographic and dry etch techniques.

In one example, the cavity is etched in the amorphous silicon using Xenon difluoride (XeF2) or other fluorine based process etching techniques.

An infrared (IR) detector comprising: a substrate having tungsten plugs deposited therein and having a CMOS readout circuitry operatively connected thereto; a layer of silicon oxide deposited on the substrate and the layer of silicon including a hole over the tungsten plugs; a layer of copper is deposited on the layer of silicon oxide, the layer of copper acting as an IR photon reflector, a layer of amorphous silicon deposited on the substrate and the layer of copper, the layer of amorphous silicon being further planarized; at least one contact hole etched through the layer of amorphous silicon so as to clear the at least one contact hole down to an underlying tungsten plug; a layer of CMOS interconnect deposited in the at least one hole; a layer of graphene deposited on the substrate; and wherein the layer of graphene are suspended over the substrate via an etching technique that creates a gap between the layer of graphene and the underlying substrate, thereby generating the IR detector.

In one example, the hole is created using a photolithography procedure.

A method for fabricating an infrared (IR) detector, the method comprising the steps of: providing a substrate; forming first and second spaced apart conductive terminals in the substrate; forming a thin metal film on the substrate so that the metal film serves as an IR photon reflector layer; depositing a layer of amorphous silicon on the substrate; forming a CMOS interconnect thin film above the conductive terminals and delineate interconnect structures; depositing a layer of bundled graphene on the substrate; and etching a cavity in the amorphous silicon layer to thereby create a gap between the bundled carbon nanotube fabric and the substrate such that the bundled carbon nanotube fabric is suspended above the substrate, thereby fabricating the IR detector.

In one example, the interconnect structures are delineated using standard photolithographic and dry etch techniques.

In one example, the cavity is etched in the amorphous silicon using Xenon difluoride (XeF2) etching techniques.

BRIEF DESCRIPTION OF THE DRAWINGS

The invention description below refers to the accompanying drawings, of which.

DETAILED DESCRIPTION

The present disclosure relates to a graphene nanoparticle structure that can be deposited atop an infrared (IR) radiation detecting system (e.g., microbolometer detector structure) to improve the efficiency thereof. In particular, the graphene nanoparticle structure, including one or more layers of graphene monolayers and one or more nanoparticles disposed therein, can be formed atop an amorphous silicon or vanadium oxide top surface of an existing microbolometer structure. The nanoparticles can include one or more of vanadium oxide (VxOy) or silicon. One aspect of the disclosure provides a silicon or other semiconducting containing readout circuits in a substrate, graphene layers, VxOy or silicon nanoparticles, first and second conducting interconnects each in electrical communication with the graphene-VoXy (G-VoXy) or graphene-silicon (G-Si) nanocomposite.

Figure 1:
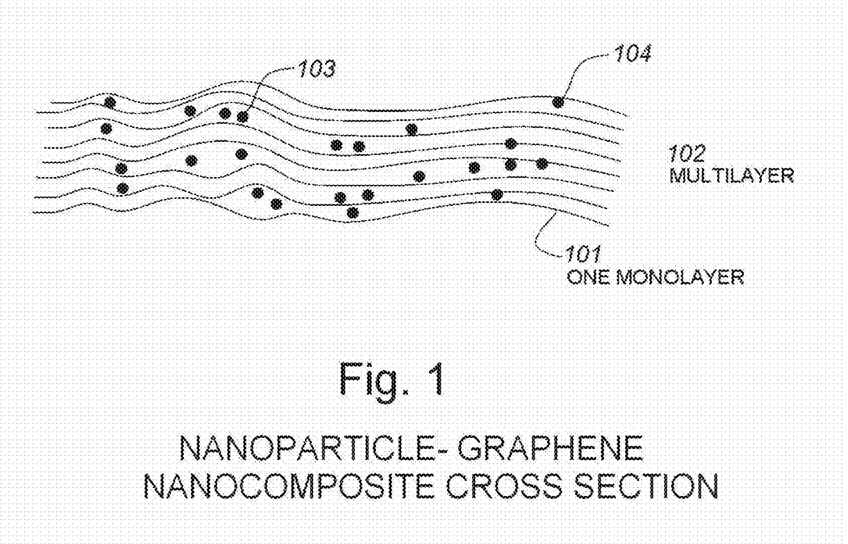
FIG. 1 depicts a cross section of a multilayer 102 graphene nanoparticle structure according to one or more aspects of the disclosure and FIG. 1B depicts a magnified cross section of the multilayer structure.
Figure 1B:
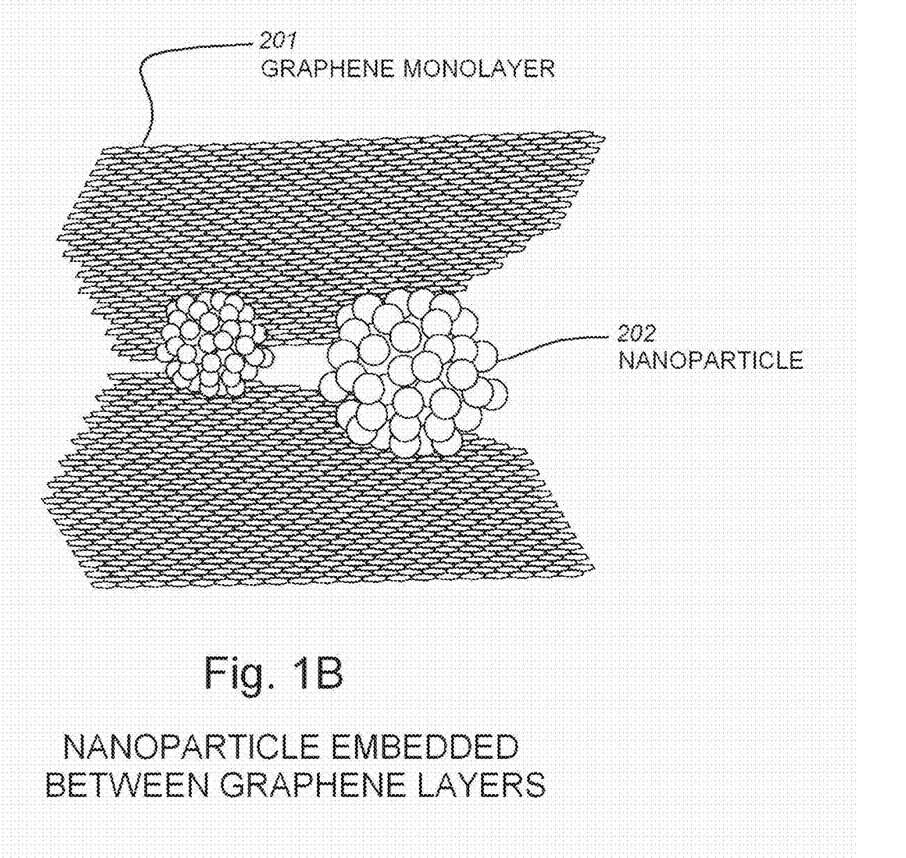

FIG. 1 depicts a cross section of a multilayer 102 graphene nanoparticle structure according to one or more aspects of the disclosure and FIG. 1B depicts a magnified cross section of the multilayer structure. As described above, the multilayer structure can be deposited atop an amorphous silicon or vanadium oxide top surface of an existing microbolometer structure.

As shown, the multilayer 102 structure can include one or more monolayers 101 and one or more nanoparticles 103, 104 disposed between respective monolayers 101. The nanoparticles can be one or more of VxOy or silicon nanoparticles. The monolayers 101 can have a thickness of approximately 1-10 nm or less, or can be composed of several layers of overlapping graphene to create a multilayered film of equal to or less than 60 nm, e.g, as many as 60 or more layers. The monolayer 101 can be grown or deposited on a surface, as described above, to form a contiguous film of a given density. This film can then be patterned to a minimum feature size of approximately 1 nm. More typically, the lower dimension sizes of the graphene film (s) are a consequence of lithographic technology limitations and not any limitations inherent in the preferred embodiments of the invention. After patterning, the NBGS can be further integrated with metal interconnects and dielectric passivation layers to create a circuit element.

When integrated into vanadium oxide or amorphous silicon microbolometer, percolation in the G-VoXy or the G-Si nanocomposite can be optimized for the IR detector performance by modulating the concentration VxOy or silicon nanoparticles on the surface of the graphene thin film and by addition of graphene monolayers. Performance can be increased up to 10% surface concentration of nanoparticles on top of monolayers, but beyond 10% degradation occurs due to quantum efficiency. In addition IR radiation absorption can be optimized by increasing the number of graphene layers. Different methods for constructing the detector proposed in this application include a combination of graphene thin films where the interface between an existing VxOy particle film on a suspended NEMS structure (nano electromechanical structure) a VxOy or silicon nanoparticle serves as the interface between the initial graphene film and the additional graphene monolayer films. In addition graphene VoXy or silicon nanocomposites are independent of Nyquist frequency limitations found in other IR sensors because of the lack of 1/f or flicker noise sources. In addition graphene layers can be tuned for electrical conductivity by low temperature oxidation (125-240 C). This physical process can be used to modify the temperature coefficient of resistance required for microbolometer sensitivity optimization. The VxOy nanoparticles and the various oxidation states thereof can also be tailored for IR bolometer sensitivity performance. These detectors are fabricated on CMOS foundry wafers resulting in large format focal planes greater than 1000×1000 and pixel sizes only limited by photolithographic technologies. The increase in temperature coefficient of resistance claimed within results in IR detectors capable of NEDT of less than 10 mK at low production cost.

Nanoparticle bundled graphene nanostructures suspended over gaps (for example, approximately 50-250 nm) (see figure one) can be employed as Infrared (IR) radiation detectors. In addition, the application of bundled graphene on a thermally isolated cantilever beam can be employed as an IR radiation detector among other devices and users. One possible technique that can be used to detect electromagnetic radiation is a resistive type micro-bolometer that is used to detect electromagnetic radiation. This detects radiation because its electrical resistance changes as its temperature rises due to the absorption of electromagnetic radiation.

Nanoparticle bundled graphene nanostructure (NBGS) based IR detectors have several unique features that are not available with existing technologies. First, arrays of these NBGS detectors can be formed using patterning technology at minimum dimensions of the lithography node used or dictated by the demands of the optical imaging system. It is possible to create 25, 17, or 8, or even less, micron square detectors limited only by photolithography techniques, see FIG. 7 below.

The various illustrative embodiments of the disclosure allow integration at a level of one light detector per ten or less transistors at the minimum dimension of a given lithography node or the integration of large arrays that are addressed by CMOS pre-amplification or readout and logic circuits. Previously only discrete components, such as silicon p-n diodes, could be used as light detectors for optoelectronic circuits. Other types of detectors require complex and difficult fabrication techniques such as flip-chip processes to integrate with silicon semiconductor technology. Because CNT light sensors can be integrated to form VLSI arrays, thus enabling optical interconnects with one light detector per transistor (or waveguide, depending on function), the fabrication of ultra-dense optical circuits is possible.

Light detectors can be constructed using suspended or non-suspended nanoparticle bundled graphene based fabrics in combination with appropriate substrates. Fabrication techniques to develop such horizontally- and vertically-disposed fabrics and devices composed of nanotube fabrics which comprise redundant conducting graphene may be created via CVD, or by room temperature operations as described herein. Reference is now made to FIGS. 3 through 7, showing the various stages of the fabrication procedure for an IR detector incorporating bundled graphene.

FIG. 1 shows a schematic diagram of an IR detector having a nanoparticle bundled graphene sensing element fabricated on a generic CMOS wafer. The IR detector incorporates a bundled nanoparticle graphene sensing element for performing the infrared detection. The IR detector, which is part of the overall CMOS logic [101]. There is a film [103] deposited on the substrate {301} which is the vanadium oxide or amorphous silicon surface for performing the IR detection. The IR detector [301] is fabricated in accordance with the procedures outlined in FIGS. 3-7. Light impinged on the open area of these bundled nanoparticle bundled graphene fabrics causes the generation of heat in the NBGS, such as a bolometer.

Suspended bundled graphene are ideal structures for monolayered NBGS, which have a high porosity. Since the substrate may influence the detection of radiation, the suspended region should diminish any disadvantageous substrate thermal isolation effects.

Graphene are able to carry extremely high current densities. They also have the highest known thermal conductivity, and are thermally and chemically stable.

A bundled nanoparticle graphene based microbolometer structure FIG. 1 {101,102,103] is shown, having readout locations {201} The structure [101,102,103] includes a carbon nanotube fabric [112] suspended above the substrate 313, in accordance with the techniques described herein and readily apparent to those having ordinary skill.

FIGS. 2A-F depict an amorphous silicon microbolometer structure at various stages in a method of manufacturing according to one or more aspects of the disclosure.

Due to the mechanical properties of the microbolometer structure and in order not to modify the underlying CMOS circuit performance, the next steps for the three proposed embodiments must not surpass 150 degrees C. or use etch chemistries that are incompatible with the underlying structure. Such incompatible etch chemistries include chemistries including carbon of any kind, as the use of carbon could result in carbon entering the cavity 111, which could render the detector structure inoperable.

Figure 2A:
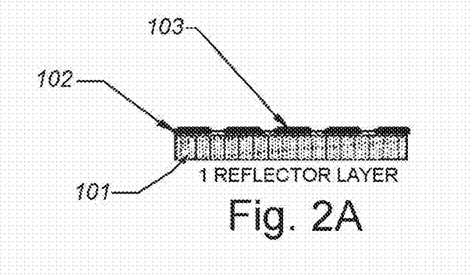
FIGS. 2A-F depict a amorphous silicon microbolometer structure at various stages in a method of manufacturing according to one or more aspects of the disclosure.

At FIG. 2A, using standard CMOS microelectronics processing techniques, a layer 102 of SiO2 is deposited on a substrate 101 (including Si and/or CMOS circuitry). A photolithography method is used to create one or more delineated holes over tungsten plugs (e.g. metal studs 302), which serve as interconnects to the underlying CMOS pre-amplification circuitry. Electron beam evaporation or direct current sputtering can be used to deposit a reflection layer 103 on the layer 102. The reflection layer 103 can comprise either copper or gold and can serve as an IR photon reflector. The layer 103 can be delineated into a square which will define the ultimate detector cavity (element 111 described below).

Figure 2B:
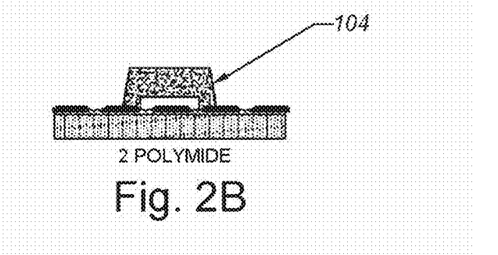

At FIG. 2B, a layer 104 of sacrificial material, such as polyimide of amorphous silicon, is deposited atop the reflection layer 103 and delineated into the same pattern as layer 103 using photolithographic techniques.

Figure 2C:
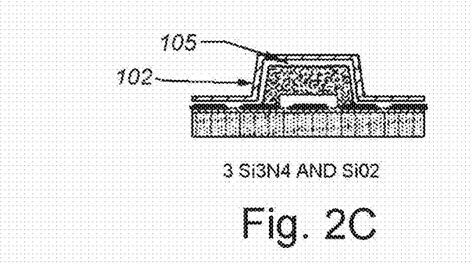

At FIG. 2C, a thin film 105 of $Si_3N_4$ and $SiO_2$ is deposited on top of the sacrificial layer 104. The $Si_3N_4$ can be deposited first and the $SiO_2$ can be deposited atop the $Si_3N_4$, with the combination of the layers forming thin film 105 atop the polyimide layer 104.

Figure 2D:
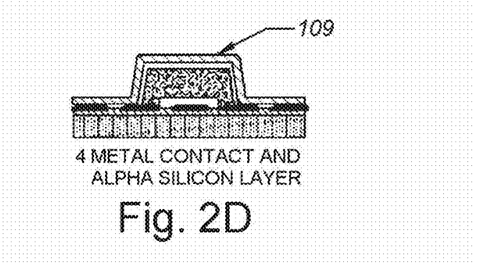

At FIG. 2D, a thin film 109 of amorphous silicon can be deposited using ion assisted deposition technique of chemical vapor deposition. The thin film 109 can be planarized using chemical-mechanical polishing.

Figure 2E:
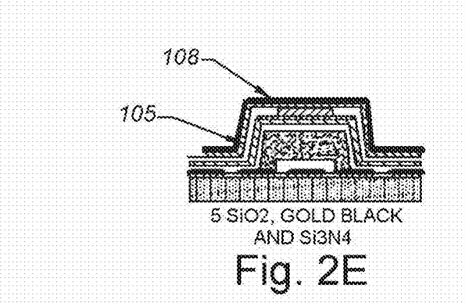

At FIG. 2E, thin films of $SiO_2$, gold black and $Si_3N_4$ can be deposited to form film 108 atop thin film 109. The films of $SiO_2$, gold black and $Si_3N_4$ are selected to as to minimize reflections and to provide mechanical structure of the microbolometer structure.

Figure 2F:
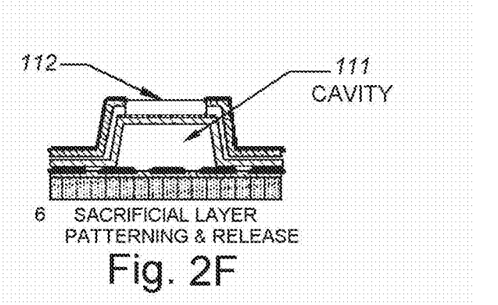
Figure 3A:
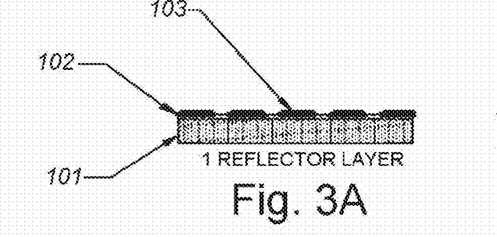
FIGS. 3A-F depict a vanadium oxide microbolometer structure at various stages in a method of manufacturing according to one or more aspects of the disclosure.
Figure 3B:
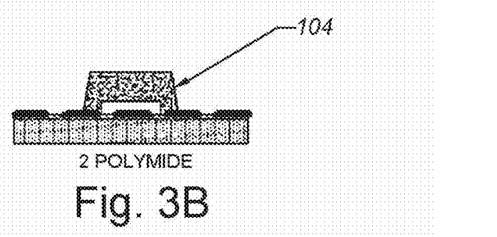
Figure 3C:
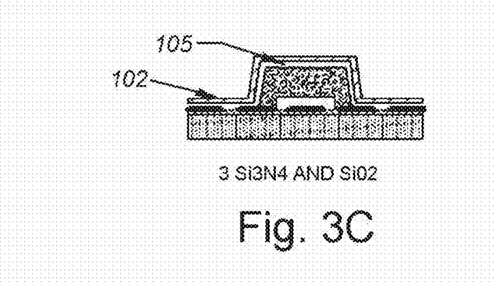
Figure 3D:
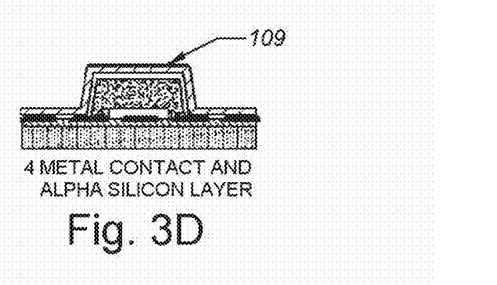
Figure 3E:
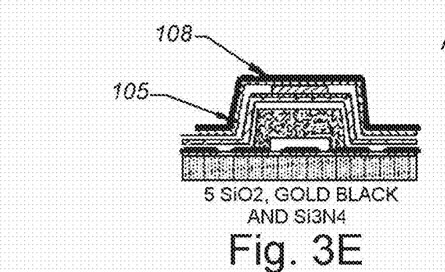
Figure 3F:
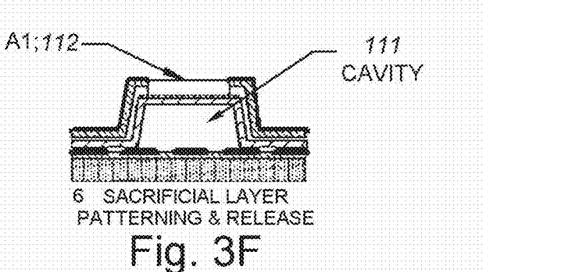

At FIG. 2F, the sacrificial layer can be etched to to create the detector cavity 111 and the thin films 108 (comprising $SiO_2$, gold black and $Si_3N_4$) can be etched to expose a portion 112 of the amorphous silicon layer 109 using photolithographic/etch techniques, such as $XeFl_2$, Cl or $H_2$ etching or another appropriate technique known to those skilled in the art. The amorphous silicon in the cavity is etched and the cavity is created, the device is fully fabricated. Such portion 112 of the layer 109 can serve as the amorphous silicon layer upon which graphene nanoparticle nanocomposites, such as those described above, can be deposited.

According to the illustrative embodiment, light detecting elements can have a suspended region 112 overlying a gap 111, above substrate material 101. The gap is created using techniques as described herein. Second substrate material 102 may be an insulator such as one listed above and may be the same insulating material as 102 or second substrate material 101 may be a semiconductor (such as, but not limited to, Si (single crystal, polycrystalline and amorphous), Ge, SiGe, SiC, Diamond, GaN, GaAs, GaP, AlGaAs, InP, GaP, CdTe, AlN, InAs, AlxIn1-xP, and other III-V and II-VI semiconductors) or a conductor (such as, but not limited to, Al, Cu, W, Al(<1% Cu), Co, Ti, Ta, W, Ni, Mo, Pd, Pt, TiW, Ru, CoSix, WSi2, TiSix, TaN, TiN, TiAlN, RuN, RuO, PtSi, Pd2Si, MoSi2, NiSix). The substrate material systems can be chosen for circuitry technologies considerations. The suspended region of nanostructure 112 defines the electromagnetic sensing region of the detecting element. The light detection from the detecting element is controlled by driving circuitry depicted in FIG. 4 below.

FIGS. 3A-F depict a vanadium oxide microbolometer structure at various stages in a method of manufacturing according to one or more aspects of the disclosure. The FIGS. 3A-F can be similar to those described above with respect to FIGS. 2A-F, with the substitution of vanadium oxide in for amorphous silicon.

Figure 5:
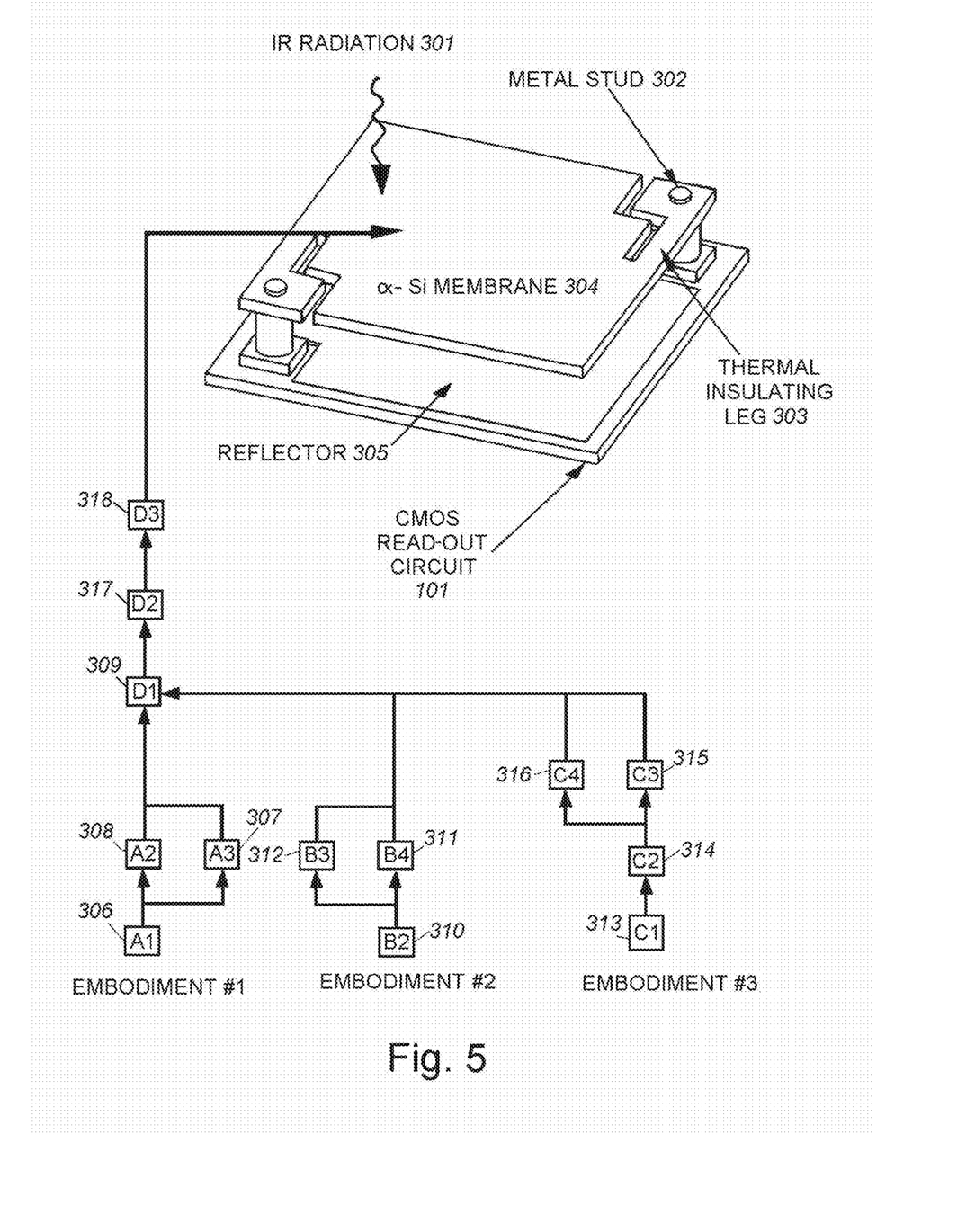
FIG. 5 depicts a process flow of depositing nanotubes, nanoparticles, and/or a thin film upon an amorphous silicon microbolometer structure.
Figure 6:
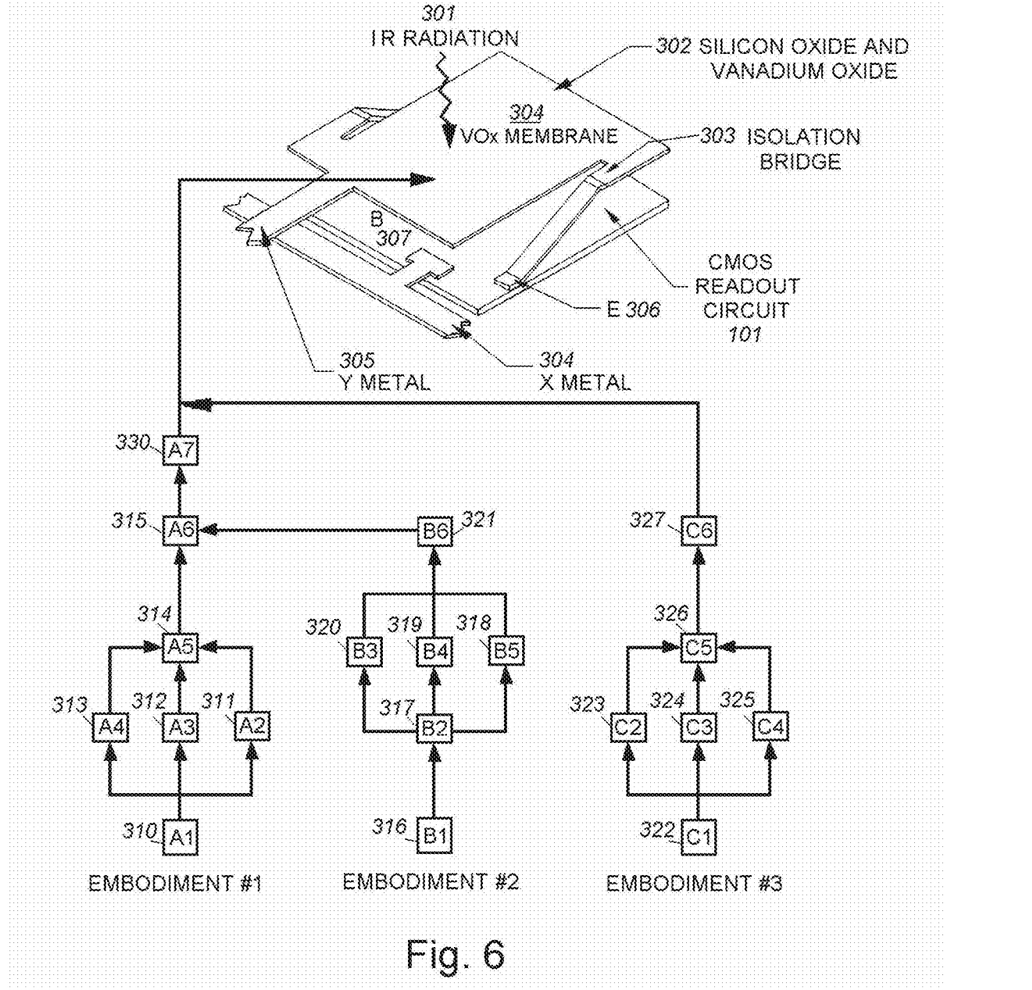
FIG. 6 depicts a process flow of depositing nanotubes, nanoparticles, and/or a thin film upon a vanadium oxide microbolometer structure.

The next step after 2F and 3F, as shown in FIG. 1, is to deposit graphene [103] in aqueous and non-aqueous casting solutions. During this process of CNT suspension, optimization of bundle behavior results from optimization of surfactant agents to achieve optimal bundle behavior. Once the optimal behavior has been determined the CNT laden solution will either be sprayed on or the use of photoresist apply, dry and bake techniques will be undertaken as shown in FIGS. 5 and 6. The final steps are to mask off the CNT bundled fabric and use standard photolithographic methods to create the image the detector design as desired.

Figure 4:
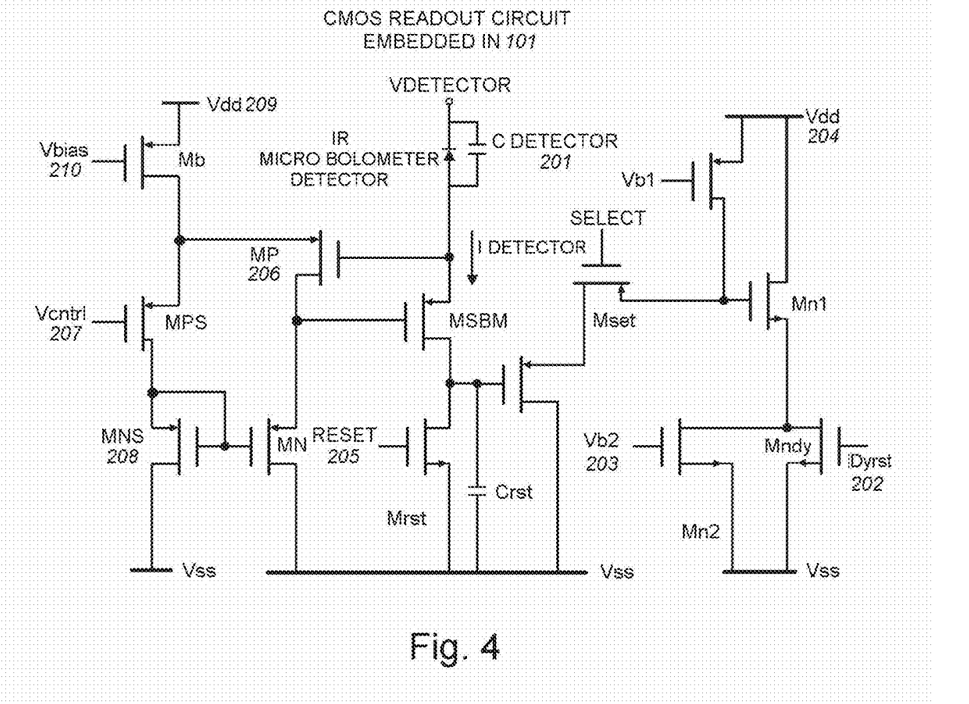
FIG. 4 depicts a CMOS readout circuit of a microbolometer structure (either amorphous silicon or vanadium oxide)

FIG. 4 depicts a CMOS readout circuit according to one or more aspects of the disclosure. As shown in FIG. 4, there is a standard half circuit 208-202 operatively connected to a unit cell circuit 201 which includes the IR detector. A dynamic discharging output stage circuit 206-210 is operatively connected to the unit cell circuit. The capacitance of the detector changes and requires a higher value capacitor in [201], and the detector bias is increased to 2-4 volts, and the preamplication in MP requires a higher gain.

FIG. 5 depicts a process flow of graphene nanoparticle nanocomposites upon an amorphous silicon microbolometer structure. As shown, the microbolometer structure includes a CMOS read-out circuit, such as the circuit described above in FIG. 4. The structure can also include a reflector 305 (comprising copper or gold, which can reflect light back up to detector), a metal stud 302 (comprising e.g., a tungsten plug that serves as a connection to CMOs circuitry), a thermal insulating leg 303 that provides thermal insulation, and a cantilevered amorphous silicon layer 304 that serves as the detection component. The layer 304 can be the exposed portion 112 of amorphous silicon described in FIG. 2 and can serve as the layer 3 upon which graphene nanoparticle nanocomposites, such as those described above, can be deposited.

At block 306 (A1), using the chemical vapor deposition technology, graphene deposition is conducted under the following process conditions. The first monolayer is deposited on the α-silicon layer of the IR detector at process temperatures less than 150 degree centigrade using a thermal decomposition of 6H-silicon stoichiometric compound. The base pressure is pumped down to less than $1\times10$-7 Torr and three H2 anneals at 150 degree centigrade are carried out for one hour each to eliminated surface water absorbed during previous processing. Once this is complete, the 6H-silicon flow is undertaken at 1 sccm to 100 sccm at 150 degrees Centigrade until the first monolayer is deposited. Deposit α-silicon nanoparticles in spray deposit—0.01 to 10% by volume. Rotate the wafer from 10-500 rpm and apply to wafer. Random nanoparticles will spread over the wafer surface uniformly. Then a second monolayer is deposited proceeded by the three successive H2 anneals.

At block A2, after creating the graphene films described above, the second and n-layers are aligned using a high voltage field coupled to the wafer aligning or partially aligning graphene films with respect to each other after applying a high voltage field. (50-250V). The degree of alignment is tunable depending on the voltage level and application duration.

At block A3, for the random case, CVD deposition of graphene layers are deposited, but the number of layers is limited to 5 monolayers in casting solvent, shake well to disperse in solution.

At block B2, deposit α-silicon nanoparticles in spray deposit—0.01 to 10% by volume. Rotate the wafer from 10-500 rpm and apply to wafer. Random nanoparticles will spread over the wafer surface uniformly.

At block B3, after creating the graphene films described above, using a high voltage field coupled to the wafer aligning or partially aligning the graphene films after applying a high voltage field. (50-250V). The degree of alignment is tunable depending on the voltage level and application duration.

At block B4, deposit silicon nanoparticles in spray deposit—0.01 to 10% by volume. Rotate the wafer from 10-500 rpm and apply to wafer. Random nanoparticles will spread over the wafer surface.

At block C1, using DC Sputtering or e-beam evaporation, deposit a non-continuous thin film of either Si3N4 or SiO2 on the wafer surface. The deposition of films without features is dependent on the deposition time, where the island coalesce into a continuous film. In the case where features such as stripes are required, a molybdenum mask with the appropriate features is fabricated. The deposition is then conducted through the mask and the features are deposited on wafer.

At block C2, using the chemical vapor deposition technology, graphene deposition is conducted under the following process conditions. The first monolayer is deposited on the α-silicon layer of the IR detector at process temperatures less than 150 degree centigrade using a thermal decomposition of 6H-silicon stoichiometric compound. The base pressure is pumped down to less than $1\times10$-7 Torr and three H2 anneals at 150 degree centigrade are carried out for one hour each to eliminated surface water absorbed during previous processing. Once this is complete, the 6H-silicon flow is undertaken at 1 sccm to 100 sccm at 150 degrees Centigrade until the first monolayer is deposited. Deposit α-silicon nanoparticles in spray deposit—0.01 to 10% by volume. Rotate the wafer from 10-500 rpm and apply to wafer. Random nanoparticles will spread over the wafer surface uniformly. Then a second monolayer is deposited proceeded by the three successive H2 anneals.

At block C3, after creating the nanotube films described above, using a high voltage field coupled to the wafer aligning or partially aligning graphene monolayer after applying a high voltage field. (50-250V). the degree of alignment is tunable depending on the voltage level and application duration.

At block C4, for the random case, CVD deposition of graphene layers are deposited, but the number of layers is limited to 5 monolayers in casting solvent, shake well to disperse in solution At block D1, to ensure attachment of the nanoparticles to the CNTs a H2 or Cl2 glow discharge etch is undertaken. In a vacuum system a circular copper coil is coupled to a RF power supply and after achieving base pressure of less the 5 microns, either H2 or Cl2 is flowed in 1-15 sccm flows. The discharge is ignited and the surface of graphene monolayers are etched resulting in dangling carbon bonds which the nanoparticles will attach themselves to.

At block D2, after creating the graphene films described above, using a high voltage field coupled to the wafer aligned or partially align graphene films after applying a high voltage field. (50-250V). This is tunable depending on the voltage level and application duration. Using either an aqueous or non-aqueous solution the nanoparticles are suspended in the casting solvent. The concentration of silicon nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block D3, using either argon or H2 in N2 at 2% by volume put wafers in an oven at 50-150 degree Celsius and anneal for 1 to 60 minutes to obtain a stable nanostructure.

FIG. 6 depicts a process flow of depositing graphene nanoparticle nanocomposites upon a vanadium oxide microbolometer structure. As shown, the vanadium oxide microbolometer structure can include a layer 302 of SiO2 and and a layer of vanadium oxide atop of the SiO2, thereby forming the cantilevered VOx detection member. The structure can also include an isolation bridge 303 (e.g., nickel to provide thermal isolation), copper or aluminum top terminal layers (e.g., Y metal 305, X metal 304, E 306, B 307) and CMOS readout circuit 101, such as circuitry described above in FIG. 4.

At block A1, using the chemical vapor deposition technology, graphene deposition is conducted under the following process conditions. The first monolayer is deposited on the α-silicon layer of the IR detector at process temperatures less than 150 degree centigrade using a thermal decomposition of 6H-silicon stoichiometric compound. The base pressure is pumped down to less than 1×10−7 Torr and three H2 anneals at 150 degree centigrade are carried out for one hour each to eliminated surface water absorbed during previous processing. Once this is complete, the 6H-silicon flow is undertaken at 1 sccm to 100 sccm at 150 degrees Centigrade until the first monolayer is deposited. Deposit α-silicon nanoparticles in spray deposit—0.01 to 10% by volume. Rotate the wafer from 10-500 rpm and apply to wafer. Random nanoparticles will spread over the wafer surface uniformly. Then a second monolayer is deposited proceeded by the three successive H2 anneals.

At block A2, after creating the graphene films described above, the second and n-layers are aligned using a high voltage field coupled to the wafer aligning or partially aligning graphene films with respect to each other after applying a high voltage field. (50-250V). the degree of alignment is tunable depending on the voltage level and application duration.

At block A3, for the random case, CVD deposition of graphene layers are deposited, but the number of layers is limited to 5 monolayers in casting solvent, shake well to disperse in solution.

At block A4, for the random case, CVD deposition of graphene layers are deposited, but the number of layers is limited to 5 monolayers.

B1 Using a tube furnace at 150 C 10-50 sccm flow Argon, process the wafers for one hour to drive off H20 absorbed from previous processing At block B2, using either an aqueous or non-aqueous solution the nanoparticles are suspended in the casting solvent. The concentration of VxOy nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block B3, after creating the graphene films described above, using a high voltage field coupled to the wafer aligning or partially aligning the graphene films after applying a high voltage field. (50-250V). this alignment is tunable depending on the voltage level and application duration.

At block B4, for random tubes utilize an adhesion promoter to insure stickiness to the underlying material. This compound is HMDS (hexamethyldisalizane) in Freon vapor is used here.

At block B5, after creating the graphene films described above, using a high voltage field coupled to the wafer aligned or partially align graphene films after applying a high voltage field. (50-250V). The degree of alignment is tunable depending on the voltage level and application duration At block B6, to insure attachment of the nanoparticles to the graphene monolayers a H2 or Cl2 glow discharge etch is undertaken. In a vacuum system a circular copper coil is coupled to a RF power supply and after achieving base pressure of less the 5 microns, either H2 or Cl2 is flowed in 1-15 sccm flows. The discharge is ignited and the surface of the graphene monolayers are etched resulting in dangling carbon bond which the nanoparticles will attach themselves to.

At block C1, using DC Sputtering or e-beam evaporation deposit on non-continuous thin films of Si3N4 or SiO2 on the wafer surface. The deposition of films without features is dependent on the deposition time, where the island coalesce into a continuous film. In the case where features such as stripes are required a molybdenum mask with the appropriate features is fabricated. The deposition is then conducted through the mask and the features are deposited on wafer At block C2, using either an aqueous or non-aqueous solution the nanoparticles are suspended in the casting solvent. The concentration of silicon nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block C3, after creating graphene films described above, using a high voltage field coupled to the wafer aligned or partially align carbon nanotubes after applying a high voltage field. (50-250V). The degree of alignment is tunable depending on the voltage level and application duration.

At block C4, the deposition of each monolayer is followed by a step to attach the particles. Between each nanoparticle deposition a room temperature anneal is performed to create C—V bonds to increase the amount of stiction at the surface.

At block C5, to insure attachment of the nanoparticles to the CNTs a H2 or Cl2 glow discharge etch is undertaken. In a vacuum system a circular copper coil is coupled to a RF power supply and after achieving base pressure of less the 5 microns, either H2 or Cl2 is flowed in 1-15 sccm flows. The discharge is ignited and the surface of the nanotubes are etched resulting in dangling carbon bond which the nanoparticles will attach themselves to.

At block C6, using either argon or H2 in N2 at 2% by volume put wafers in a oven at 50-150 degree Celsius and anneal for 1 to 60 minutes to obtain a stable nanostructure.

At block A5, to insure attachment of the nanoparticles to graphene layers a H2 or Cl2 glow discharge etch is undertaken. In a vacuum system a circular copper coil is coupled to a RF power supply and after achieving base pressure of less the 5 microns, either H2 or Cl2 is flowed in 1-15 sccm flows. The discharge is ignited and the surface of the nanotubes are etched resulting in dangling carbon bond in the graphene films, which the nanoparticles will attach themselves to.

At block A6, using either an aqueous or non-aqueous solution the nanoparticles are suspended in the casting solvent. The concentration of silicon nanoparticles in the casting solvent is 0.01 to 10% by volume. The wafer is rotated at 10-100 RPM and the nanoparticles/casting solvent is sprayed on during rotation creating a uniform dispersion of nanoparticles across the wafer.

At block A7, using either argon or H2 in N2 at 2% by volume put wafers in a oven at 50-150 degree Celsius and anneal for 1 to 60 minutes to obtain a stable nanostructure.

Figure 7:
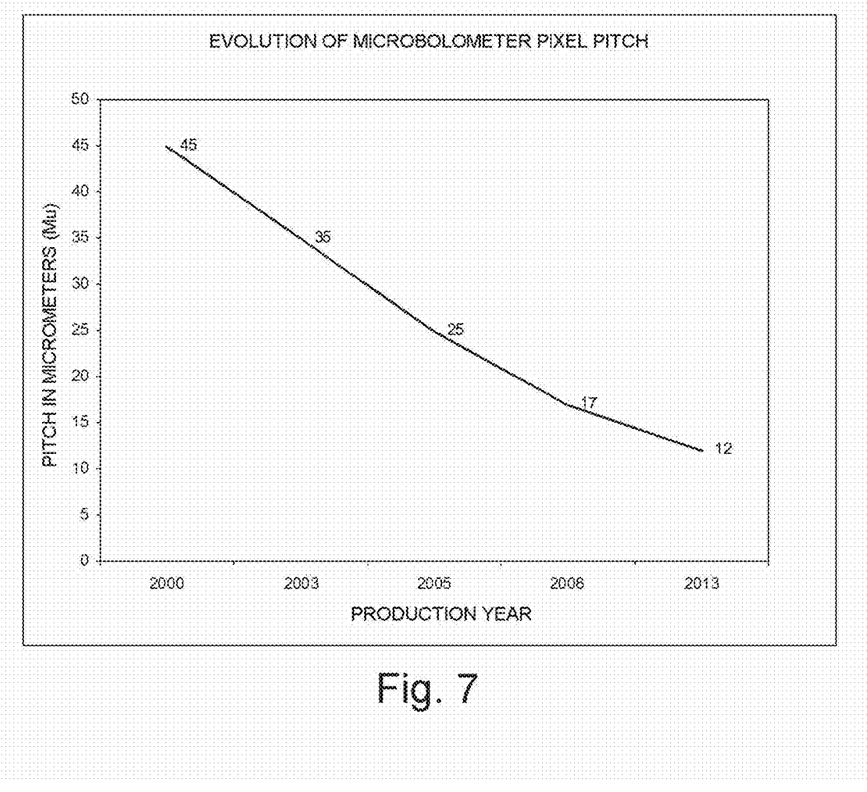
FIG. 7 is a chart depicting the downward evolution of microbolometer cell size.

FIG. 7 is a chart depicting the downward evolution of microbolometer cell size. The microbolometer examples above are all compatible with the downward evolution of microbolometer cell size as described in FIG. 7.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, the electrical connectivity of the cell structure with other cells in an array and/or an external conduit is expressly contemplated and highly variable within ordinary skill. More generally, while some ranges of layer thickness and illustrative materials are described herein, these ranges are highly variable. It is expressly contemplated that additional layers, layers having differing thicknesses and/or material choices can be provided to achieve the functional advantages described herein. In addition, directional and locational terms such as "top", "bottom", "center", "front", "back", "on", "under", "above", and "below" should be taken as relative conventions only, and not as absolute. Furthermore, it is expressly contemplated that various semiconductor and thin films fabrication techniques can be employed to form the structures described herein. Accordingly, this description is meant to be taken only by way of example, and not to otherwise limit the scope of this invention. The teachings herein can be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. An Infrared (IR) detector comprising:
   a substrate;
   a bundled graphene layer or carbon nanotube fabric suspended over the substrate and between electrical contacts, the bundled graphene layer comprising between a single atomic layer up to twenty graphene atomic layers, the carbon nanotube fabric comprising at least one of randomly dispersed carbon nanotubes or aligned by the use of an external electric DC field;
   at least one of vanadium oxide or silicon nanoparticles dispersed in either the bundled graphene layer or carbon nanotube fabric;
   first and second conductive contacts in electrical communication with the thin film of bundled graphene or carbon nanotube fabric;
   a layer of amorphous silicon or vanadium oxide on the substrate;
   a cavity in the amorphous silicon or vanadium oxide layer to thereby create a gap between the bundled graphene layer or the carbon nanotube fabric and the substrate such that the bundled graphene layer or carbon nanotube fabric is suspended above the substrate;
   wherein the bundled graphene layer or carbon nanotube fabric is tuned to be sensitive to IR radiation in the micron band of 1 to 12 microns by at least one of modulation of a concentration of nanoparticles and the exposure of IR radiation induces a change in impedance between the first and second conductive terminals which is sensed by CMOS readout circuitry.

2. The IR detector of claim 1 further comprising sensing circuitry for detecting changes in input impedance using the CMOS readout circuitry.

3. The IR detector of claim 1 wherein the bundled graphene is deposited on the substrate having an insulating layer comprised of dielectric material with a cantilever beam composed of silicon nitride, which is suspended over a channel, thereby providing thermal isolation from surrounding environments.

4. The IR detector of claim 1 wherein the bundled graphene layer comprises monolayer graphene and multi monolayer graphene having diameters corresponding to a tuned IR responsive wavelength.

5. The IR detector of claim 1 wherein the graphene are deposited on the substrate using a chemical vapor deposition (CVD) or mechanical exfoliation process.

6. The IR detector of claim 1 wherein the means for forming a cavity includes means for etching the amorphous silicon using reactive ion etch (RIE) or Ion beam assisted etching.

7. The IR detector of claim 6 wherein the means for forming a cavity includes means for etching the amorphous silicon using Xenon difluoride (XeF2) gas as an etching techniques.

* * * * *